(12) United States Patent
Zheng et al.

(10) Patent No.: US 6,944,006 B2
(45) Date of Patent: Sep. 13, 2005

(54) GUARD FOR ELECTROSTATIC CHUCK

(75) Inventors: Hui Zheng, San Jose, CA (US); Kenneth Tsai, Redwood City, CA (US); Hong Wang, Cupertino, CA (US); Yongxiang He, Sunnyvale, CA (US); Jesus G. Garcia, III, Round Rock, TX (US); Daniel M. Deyo, Cedar Park, TX (US)

(73) Assignee: Applied Materials, Inc., Santa Clara, CA (US)

( * ) Notice: Subject to any disclaimer, the term of this patent is extended or adjusted under 35 U.S.C. 154(b) by 355 days.

(21) Appl. No.: 10/406,889

(22) Filed: Apr. 3, 2003

(65) Prior Publication Data

US 2004/0196613 A1 Oct. 7, 2004

(51) Int. Cl.[7] .............................................. H01T 23/00
(52) U.S. Cl. ...................................................... 361/234
(58) Field of Search ......................................... 361/234

(56) References Cited

U.S. PATENT DOCUMENTS

| | | | |
|---|---|---|---|
| 5,326,725 A | * | 7/1994 | Sherstinsky et al. ......... 438/778 |
| 5,376,180 A | * | 12/1994 | Mahler ........................ 118/728 |
| 5,463,525 A | * | 10/1995 | Barnes et al. ................ 361/234 |
| 5,486,975 A | * | 1/1996 | Shamouilian et al. ....... 361/234 |
| 5,636,098 A | * | 6/1997 | Salfelder et al. ............ 361/234 |
| 5,740,009 A | * | 4/1998 | Pu et al. ....................... 361/234 |
| 5,748,434 A | | 5/1998 | Rossman et al. ............ 361/234 |
| 5,762,714 A | | 6/1998 | Mohn et al. ................. 118/728 |
| 5,942,042 A | * | 8/1999 | Gogh .......................... 118/728 |
| 6,039,836 A | * | 3/2000 | Dhindsa et al. ........... 156/345.1 |
| 6,074,488 A | | 6/2000 | Roderick et al. ........... 118/728 |
| 6,077,353 A | | 6/2000 | Al-Sharif et al. ........... 118/500 |
| 6,195,246 B1 | | 2/2001 | Livesay et al. ............. 361/234 |
| 6,284,093 B1 | * | 9/2001 | Ke et al. ................ 156/345.51 |
| 6,296,747 B1 | | 10/2001 | Tanaka .................... 204/298.07 |
| 6,364,957 B1 | * | 4/2002 | Schneider et al. .......... 118/728 |
| 6,500,315 B1 | | 12/2002 | Arunachalam et al. 204/192.12 |
| 6,554,954 B2 | * | 4/2003 | Ma et al. ................. 156/345.51 |
| 6,689,249 B2 | * | 2/2004 | Ke et al. .................. 156/345.3 |

* cited by examiner

*Primary Examiner*—Stephen W. Jackson
*Assistant Examiner*—James A Demakis
(74) *Attorney, Agent, or Firm*—Janah & Associates, Inc.

(57) ABSTRACT

A guard for an electrostatic chuck includes a ceramic annulus that has an inner surface shaped to fit around a circumference of the electrostatic chuck, and an outer surface having (i) a top portion with a recessed trench and (ii) a side portion. A metal coating is provided on the top portion of the outer surface.

15 Claims, 4 Drawing Sheets

GUARD FOR ELECTROSTATIC CHUCK

BACKGROUND

Embodiments of the invention relate to a guard for an electrostatic chuck that is used to hold a substrate in a plasma during processing.

In the fabrication of electronic circuits and displays, semiconductor, dielectric, or conductor materials are formed on a substrate, such as a silicon wafer or glass. The materials are typically formed by chemical vapor deposition (CVD), physical vapor deposition (PVD), oxidation, or nitridation processes. Thereafter, the materials are etched to form features such as gates, vias, contact holes and interconnect lines. In a typical etching process, a patterned mask of photoresist or oxide hard mask is formed on the substrate by photolithography, and a plasma etches exposed portions of the substrate. The plasma is an electrically conductive gaseous medium formed by inductively or capacitively coupling RF energy into a process gas.

The processes described above are typically carried out in a substrate processing apparatus that comprises a process chamber. The process chamber comprises an electrostatic chuck to hold the substrate in a process zone of the chamber. The electrostatic chuck comprises a dielectric that covers an electrode, the dielectric having a receiving surface to receive the substrate. A process gas is introduced into the chamber and the process gas is energized into a plasma to process the substrate. However, the plasma often damages the electrostatic chuck, especially by eroding a periphery of the electrostatic chuck or undesirably depositing process residues along the periphery. When the periphery comprises parts having convoluted surface topographies with crevices and small projections, this problem may be particularly acute. Additionally, if parts of the electrostatic chuck along the periphery are biased at a high voltage, electrical shorts into the plasma may occur.

Yet another problem is when the substrate is not properly aligned on the receiving surface of the electrostatic chuck. Such misalignment of the substrate can cause uneven processing. Misalignment often occurs during placement of the substrate on the receiving surface. The substrate can also shift during processing due to mechanical vibrations or non-uniform gas pressures. Such shifting of the substrate on the receiving surface can cause flaking of the process residues deposited on the electrostatic chuck.

One version of electrostatic chuck 10 comprises a protective guard 15 along the periphery 20 to protect the periphery 20 from the plasma, as illustrated in FIG. 1 (Prior Art). For example, the guard 15 may comprise a ceramic annulus that curves over the periphery 20 of the electrostatic chuck 10 to isolate the periphery 20 from the ambient plasma. Additionally, the guard 15 may comprise a ridge 25 near the substrate-receiving surface 30 to prevent excessive displacement of the substrate 35. The ridge 25 forms a tall, circular, upward protrusion from the guard 15.

However, a problem with such a protective guard 15 is that process residues 45 that deposit on the guard 15 can flake off and contaminate the process zone 40 as well as the substrate 35. Flaking increases as the thickness of the deposited process residues 45 increases. Process residues 45 also flake off when temperature fluctuations occur and cause layers of the process residues 45 having different thermal expansion coefficients to delaminate. Additionally, the tall ridge 25 is easily eroded by the plasma, shortening the operational lifetime of the guard 15. Such erosion can also cause flaking of the process residues 45 from the ridge 25, which then contaminate the substrate 35.

Thus, it is desirable to have a guard for an electrostatic chuck that can substantially prevent contamination by process residues. It is further desirable to have an electrostatic chuck guard with an increased operational lifetime. It is still further desirable to have an electrostatic chuck guard capable of maintaining proper placement of the substrate on the receiving surface of the electrostatic chuck.

SUMMARY

A guard for an electrostatic chuck comprises a ceramic annulus having (i) an inner surface shaped to fit around a circumference of the electrostatic chuck and (ii) an outer surface comprising a top portion with a recessed trench as well as a side portion. A metal coating is provided on the top portion of the outer surface.

A method of manufacturing a guard for an electrostatic chuck comprises machining a ceramic annulus to have (i) an inner surface shaped to fit around a circumference of the electrostatic chuck and (ii) an outer surface comprising a top portion with a recessed trench. A metal coating is arc sprayed on the top portion of the outer surface.

DRAWINGS

These features, aspects, and advantages of the present invention will become better understood with regard to the following description, appended claims, and accompanying drawings which illustrate versions of the invention, where:

DESCRIPTION

Figure 1:
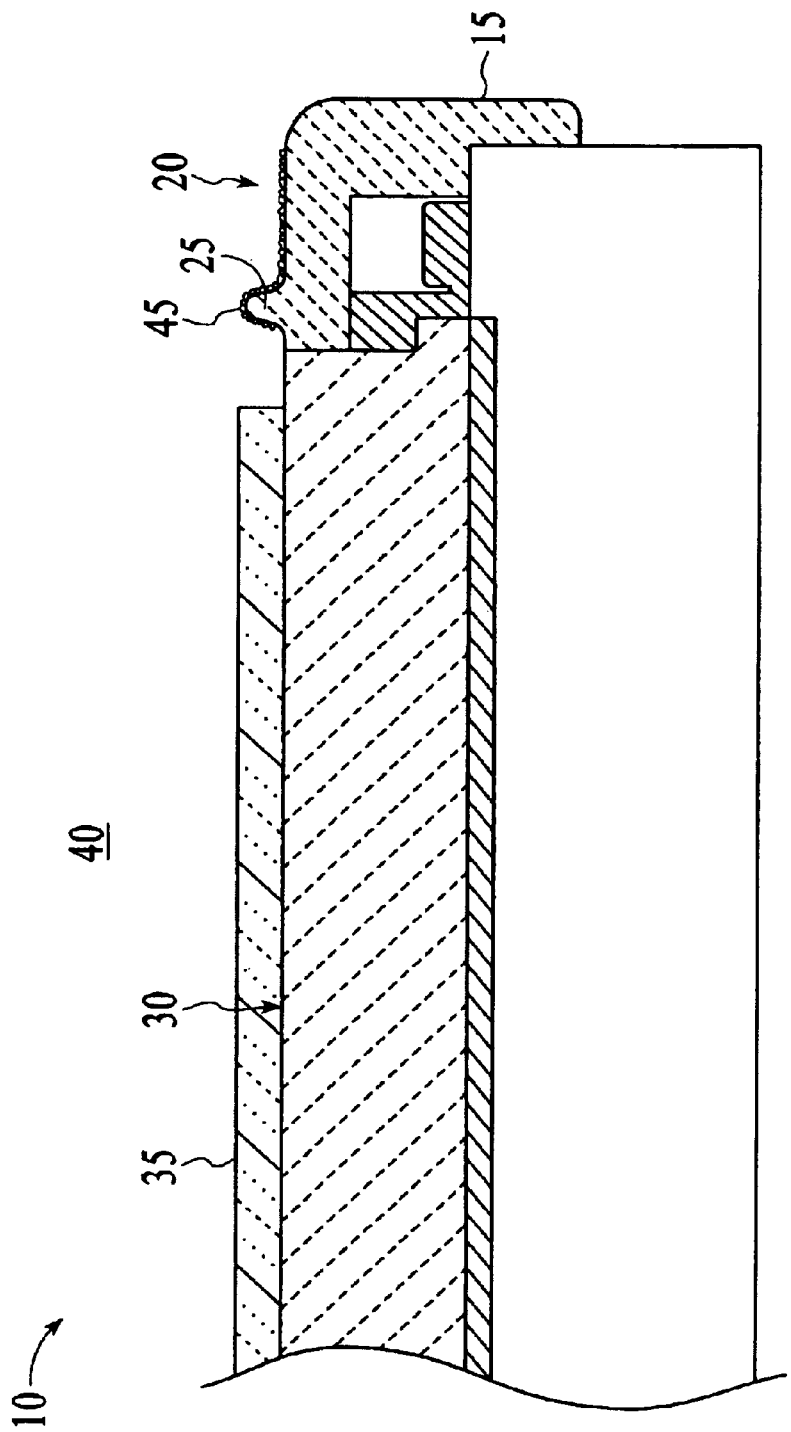
FIG. 1 (Prior Art) is a cross-sectional side view of an embodiment of an electrostatic chuck having a conventional guard.
Figure 2:
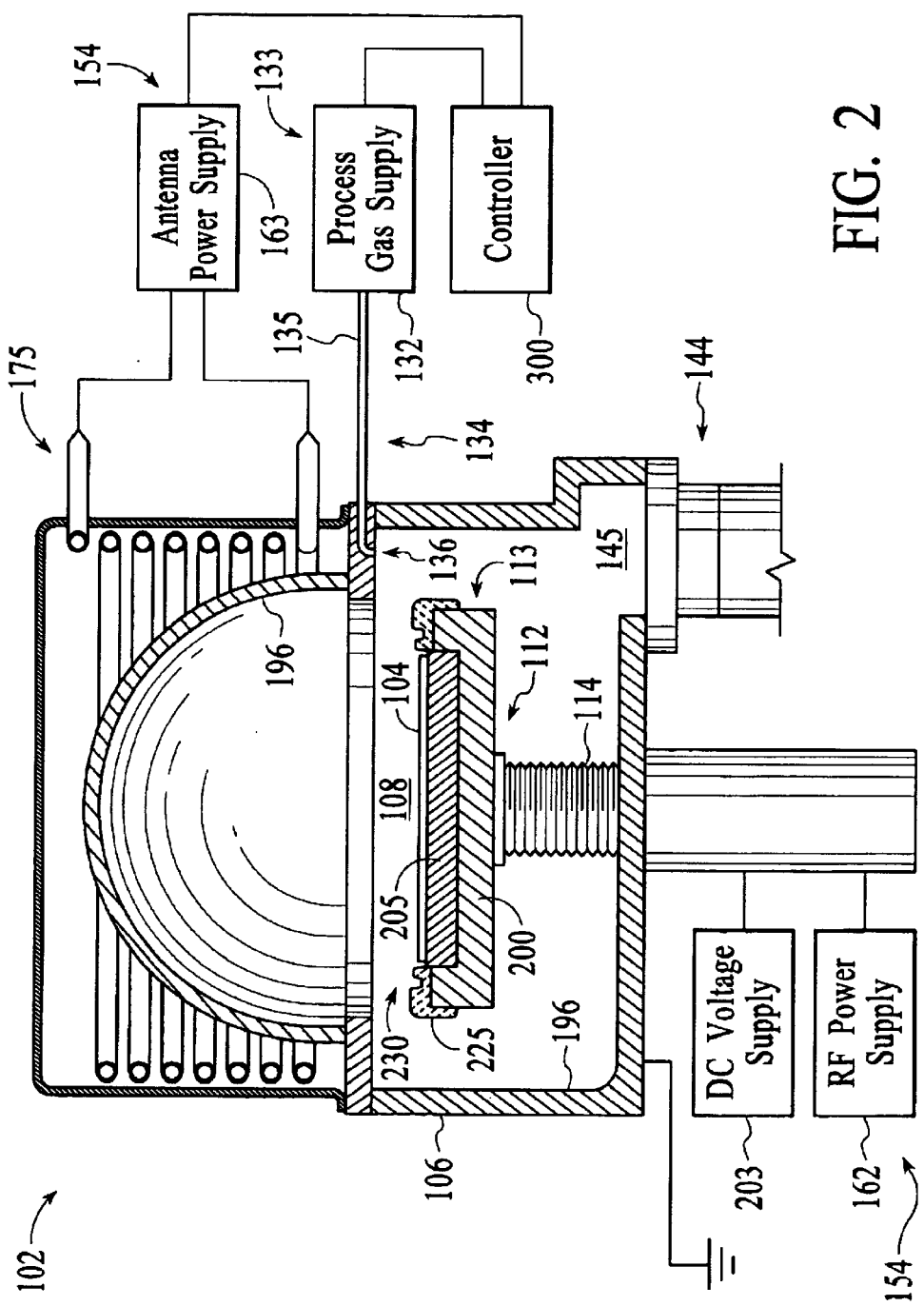
FIG. 2 is a cross-sectional side view of an embodiment of a substrate processing apparatus comprising a chamber having an electrostatic chuck with a protective guard.

An apparatus 102 suitable for processing a substrate 104 comprises a process chamber 106. In one version, the chamber 106 is a pre-clean chamber, an embodiment of which, as illustrated in FIG. 2, is a "Pre Clean IIe™" chamber fabricated by Applied Materials, Inc., Santa Clara, Calif. The pre-clean chamber is used to clean the substrate 104 before another processing step. For example, the pre-clean chamber may be used to remove an oxide film (such as silicon oxide or metal oxide) from a substrate 104 by sputter etching prior to a deposition step to ensure a clean deposition surface. A deposition surface that is contaminated with oxides can result in failure of parts manufactured from the substrate 104, such as electrical failure of electronic components manufactured from a semiconductor substrate 104. The process chamber 106 may also be adapted to process other substrates 104, such as flat panel displays, polymer panels, or other electrical circuit receiving structures. The apparatus 102 is provided only to illustrate the invention and should not be used to limit the scope of the invention or its equivalents to the exemplary embodiments provided herein.

The process chamber 106 defines a process zone 108 in which the substrate 104 is processed. The chamber 106 comprises walls 196 fabricated from a metal, ceramic, glass, polymer, or composite material, of which anodized aluminum is typically preferred, and which may have a surrounding liner (not shown).

Figure 3:
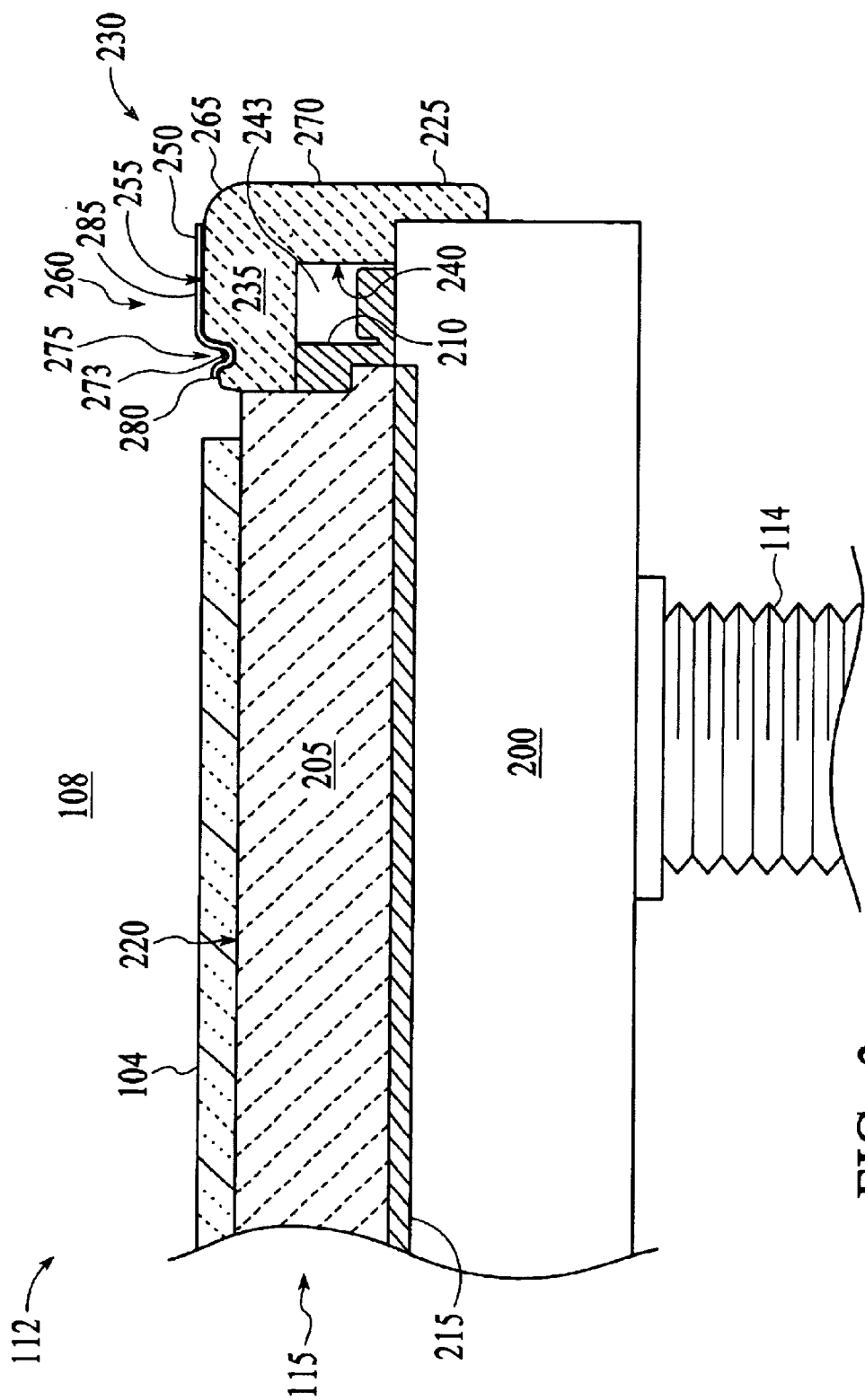
FIG. 3 is a cross-sectional side view of an embodiment of the electrostatic chuck and guard of FIG. 1.

The chamber 106 further comprises a substrate support 112 to hold the substrate 104 in the process zone 108 during processing, as illustrated in FIG. 3. The substrate support 112 comprises an electrostatic chuck 115, which comprises a puck 205 covering an electrode 215. The puck 205 comprises a dielectric or semiconductor material, and has a receiving surface 220 on which to receive the substrate 104. The puck 205 typically comprises a ceramic material, such as aluminum nitride or aluminum oxide. A DC voltage supply 203 is capable of applying an electric potential to the electrode 215 to hold the substrate 104 onto the receiving surface 220 during processing. The electrode 215 may comprise a metal layer. In one embodiment, the electrode 215 comprises molybdenum. In one version (as shown), the electrostatic chuck 115 comprises a base 200 below the puck 205. The base 200 may comprise, for example, silicon nitride. The electrode 215 is situated between the base 200 and the puck 205. Alternatively, the electrode 215 can be embedded in the puck 205. The electrode 215 is shaped and sized to correspond to the shape and size of the substrate 104, for example, if the substrate 104 is disk-shaped wafer, a disk-shaped electrode having a round or square cross-section can be used. The electrode 110 can also comprise a mesh, such as a wire mesh or a metal plate stamped with apertures. The substrate support 112 further comprises a chuck lift 114 to raise and lower the electrostatic chuck 115, and thereby also the substrate 104, into and out of the process zone 108.

A guard 225 for the electrostatic chuck 115 covers a periphery 230 of the substrate support 112 to protect the periphery 230 from deposition and erosion by process byproducts. The guard 225 comprises a ceramic annulus 235 having an inner surface 240 shaped to fit around a circumference of the electrostatic chuck 115. For example, an inner surface 240 of the ceramic annulus 235 may be radially stepped. In one embodiment, as shown in FIG. 3, the inner surface 240 may comprise three discrete radii to accommodate the shape of the electrostatic chuck 115. The ceramic annulus 235 may also be shaped to provide a gap 243 between the inner surface 240 and the electrostatic chuck 115, also as shown in FIG. 3. If the electrostatic chuck 115 comprises a base 200, a clamp 210 is provided to secure the puck 205 onto the base 200. In this version, the guard 225 may cover the clamp 210 from the top and radial outside. The ceramic annulus 235 may comprise a ceramic material that is adapted to prevent flaking of byproduct depositions. In one embodiment, the ceramic annulus 235 comprises at least 99% $Al_2O_3$ (alumina), such as about 99.5% $Al_2O_3$.

The guard 225 for the electrostatic chuck 115 comprises an outer surface 255 having a top portion 260 with a recessed trench 275 to collect deposition byproducts. Typically, the recessed trench 275 is circular to symmetrically follow the circular shape of the guard 225. The trench 275 may have a width of from about 2.9 to about 5.6 millimeters. The ratio of width to height of the trench may also be from about 2.4 to about 4.4. When the substrate 104 is processed, byproduct depositions 273 collect in the recessed trench 275. For example, when a undesirable oxide layer of the substrate 104 is sputter etched, the etched oxide material is released into the process zone 108 and collects in the recessed trench 275. The recessed trench 275 prevents flaking of the byproduct depositions 273 by adhering and containing the byproduct depositions 273 into a ring formation that is contained from the radially inward and radially outward sides of the recessed trench 275.

The guard 225 further comprises a raised rim 280 radially inward of the recessed trench 275 to prevent the substrate 104 from sliding off of the electrostatic chuck 115. The raised rim 280 is sized such that the substrate 104 resting on the electrostatic chuck 115 is held in place by the raised rim 280. The raised rim 280 may be spaced such that there is a gap 243 between the substrate 104 and the raised rim 280 when the substrate 104 is properly positioned. If the substrate 104 is moved excessively out of place, the raised rim 280 prevents the substrate 104 from moving farther. The presence of the recessed trench 275 adjacent to the raised rim 280, as well as the shape of the raised rim 280, protect the raised rim 280 from erosion by the plasma and thereby effectively increase the operational lifetime of the guard 225.

The outer surface 255 also comprises a side portion 270. For example, the outer surface 255 may form a substantially arcuate profile from the top portion 260 to the side portion 270. The outer surface 255 curves radially outwardly and downwardly across a downwardly curving portion 265 from the top portion 260 to the side portion 270. The ceramic annulus 235 comprises the raised rim 280 at a first height, the recessed trench 275 at a second height less than the first height, and an outer plateau 250 at a third height larger than the first height. The outer plateau 250 is radially outward of the recessed trench 275, and the recessed trench 275 is radially outward of the raised rim 280. The recessed trench 275 thus blocks deposition byproducts 273 that flake off from the outer plateau 250 from contaminating the substrate 104.

The guard 225 for the electrostatic chuck 115 may further comprise a metal coating 285 formed on the top portion 260 of the outer surface 255 of the guard 225 to improve the adhesion properties of the top portion 260. Typically, the metal coating 285 covers the recessed trench 275 as well as a neighboring area on the top portion 260 to particularly improve the adhesion of byproduct depositions 273 in that area. The metal coating 285 may comprise, for example, aluminum. The metal coating 285 may comprise a looped strip having a width of from about 7.6 to about 12.7 mm. Additionally, the metal coating 285 may be separated from the inner radius of the ceramic annulus 235 by a distance of from about 0.25 to about 0.76 mm. The metal coating 285 increases the adhesion of byproduct depositions 273 onto the guard 225.

In the manufacture of the guard 225, a ceramic annulus 235 is machined to comprise an outer surface 255 comprising a top portion 260 with the recessed trench 275. The guard 225 may be machined out of a ceramic preform, such as a polycrystalline alumina monolith. The ceramic preform may be in the shape of a tube. The ceramic preform can be machined using a diamond tip to cut, polish, and grind the ceramic. For example, a ceramic preform tube can be sliced and machined into the shape of the guard 225.

The top portion 260 of the guard's outer surface 255 is texturized to improve the surface adhesion of the metal coating 285 onto the outer surface 255. The outer surface 255 where the metal coating 285 is to be formed is roughened, and a strip beyond the extent of the metal coating 285 may also be roughened. For example, the top portion 260 of the outer surface 255 may be roughened in a strip having a width of from about 10 to about 15 millimeters. The outer surface 255 may be texturized to have a desirable surface roughness average ($R_a$) of from about 1 to about 4 micrometers to improve adhesion of the metal coating 285. In one embodiment, the outer surface 255 is scratched with a silicon carbide tool.

Figure 4:
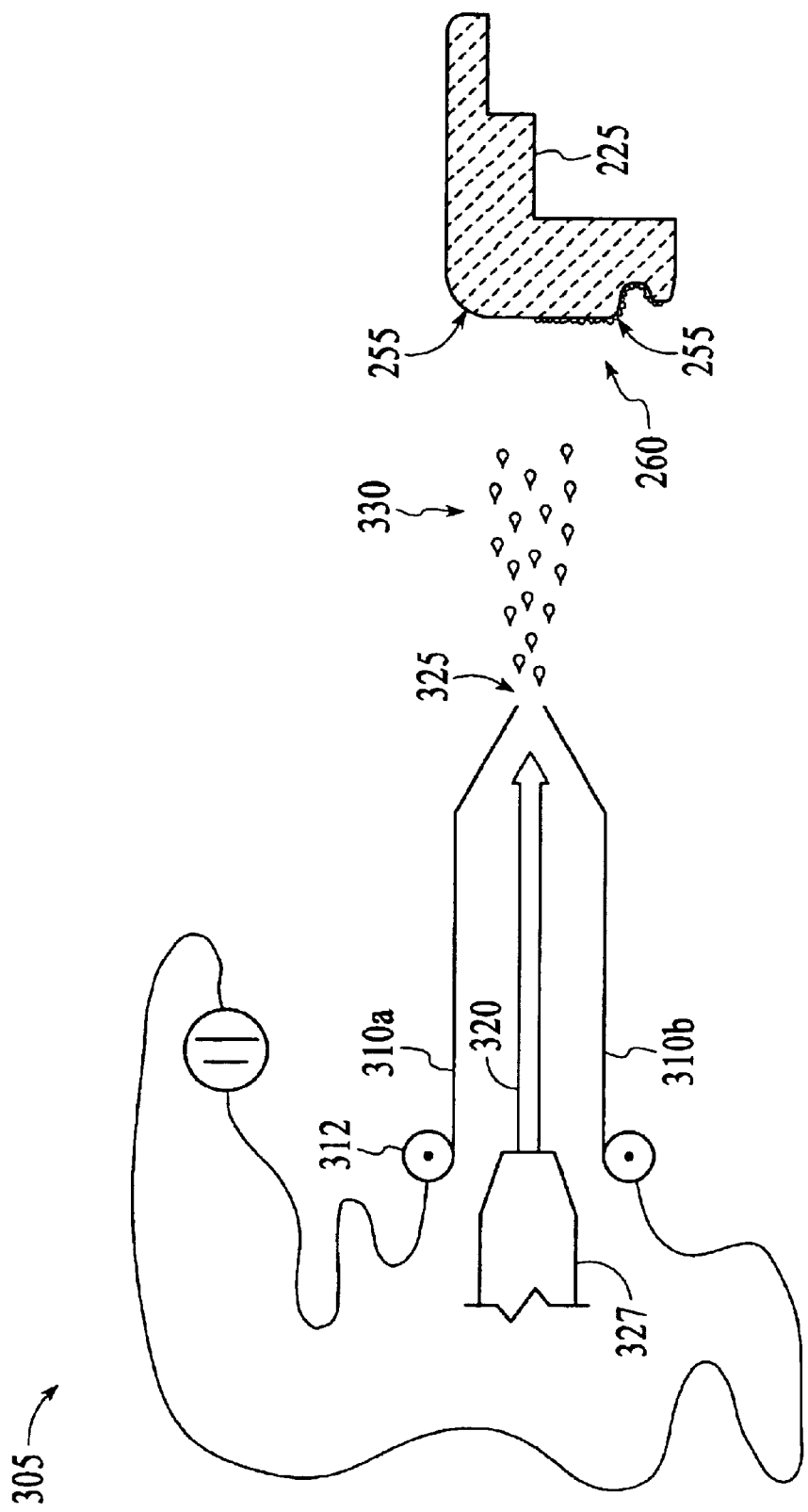
FIG. 4 is a cross-sectional side view of a twin-wire arc-spray device that sprays a metal coating on a ceramic annulus of the guard of FIG. 3.

The coating 285 can be arc-sprayed onto the outer surface 255, such as by using a twin-wire (electrical) arc spray device 305, as illustrated in FIG. 4. The twin-wire arc spray device 305 comprises two nearby metal wires 310$a,b$ between which a sufficiently high voltage is applied to generate an electrical arc 325 therebetween. The metal wires 310a,b are pulled from a reel 312 and melted in the electrical arc 325 at the tips of the wires 310a,b. A nozzle 327 ejects a gas stream toward the electrical arc 325 to project the molten metal material 330 onto the top portion 260 of the guard's outer surface 255. The metal material 320 may comprise, for example, aluminum, as described above. The gas stream can comprise clean dry air (CDA), nitrogen, or argon. An exemplary embodiment of an appropriate twin-wire arc spray device and method is described in co-assigned, pending U.S. application Ser. No. 10/032,387, entitled "Method of Fabricating a Coated Process Chamber Component," which is hereby incorporated by reference in its entirety.

Returning to FIG. 2, the other components of the process chamber 106 will now be described. The process chamber 106 further comprises a process gas supply 132 to introduce a process gas into the chamber 106. The process gas supply 132 comprises a process gas source 133 and a gas distributor 134. The process gas source 133 contains the process gas, such as a sputter etching gas. In one embodiment, the process gas source 133 contains a sputter etching gas comprising argon. The gas distributor 134 may comprise one or more conduits 135 having one or more gas flow valves (not shown) and one or more gas outlets 136 around the periphery 230 of the substrate 104 that is held on the electrostatic chuck 115. Alternatively, the gas distributor 134 may comprise a showerhead gas distributor (not shown). Spent process gas and etchant byproducts are exhausted from the chamber 106 through an exhaust 144, which may include an exhaust conduit 145 that receives spent process gas from the process zone 108, a throttle valve (not shown) to control the pressure of process gas in the chamber 106, and one or more exhaust pumps (not shown).

The process gas may be energized to process the substrate 104 by a gas energizer 154 that couples energy to the process gas in the process zone 108 of the chamber 106. In the version shown in FIG. 2, the gas energizer 154 comprises an RF power supply 162 to apply radio frequency (RF) power to the electrode 215 in the electrostatic chuck 115. The gas energizer 154 may additionally or alternatively comprise an antenna 175 having one or more inductor coils, which may have a cylindrical symmetry about the center of the chamber 106, and an antenna power supply 163 to apply power to the antenna 175, as shown in FIG. 2.

To process a substrate 104, the guard 225 is placed on the electrostatic chuck 115 in the process chamber 106. The chamber 106 is evacuated and maintained at a predetermined sub-atmospheric pressure. The substrate 104 is then provided on the substrate support 112 by a substrate transport (not shown), such as for example a robot arm and a lift pin system. The process gas supply 132 provides a process gas to the chamber 106 and the gas energizer 154 couples RF energy to the process gas to energize the gas to process the substrate 104. Effluent generated during the process is exhausted from the chamber 106 by the gas exhaust 144.

A controller 300 may be used to operate the substrate processing apparatus 102 and process chamber 106. A suitable controller 300 comprises a computer (not shown) having a central processing unit (CPU), such as a Pentium Processor commercially available from Intel Corporation, Santa Clara, Calif., that is coupled to a memory and peripheral computer components, The controller 300 may further comprise a plurality of interface cards (also not shown) including, for example, analog and digital input and output boards, interface boards, and motor controller boards. The interface between a human operator and the controller 300 can be, for example, via a display and a light pen.

While the present invention has been described in considerable detail with reference to certain preferred versions, many other versions should be apparent to those of ordinary skill in the art. For example, the substrate support described herein can be used in an etching chamber or another chamber. Therefore, the spirit and scope of the appended claims should not be limited to the description of the preferred versions contained herein.

What is claimed is:

1. A guard for an electrostatic chuck, the guard comprising:
   (a) a ceramic annulus having
      an inner surface shaped to fit around a circumference of the electrostatic chuck, and
      an outer surface comprising (i) a top portion with a recessed trench and (ii) a side portion; and
   (b) a metal coating on the top portion of the outer surface.

2. A guard according to claim 1 further comprising a raised rim radially inward of the trench, the raised rim being sized such that a substrate resting on the electrostatic chuck is held in place by the raised rim.

3. A guard according to claim 2 further comprising a plateau radially outward of the trench, the plateau being higher than the raised rim.

4. A guard according to claim 1 wherein the metal coating comprises a strip having a width of from about 7.6 to about 12.7 mm.

5. A guard according to claim 1 wherein the outer surface forms a substantially arcuate profile from the top portion to the side portion.

6. A guard according to claim 1 wherein the outer surface has a roughness average of from about 1 to about 4 micrometers.

7. A guard according to claim 1 wherein the recessed trench has a width of from about 2.9 to about 5.6 millimeters.

8. A guard according to claim 1 wherein the ratio of width to height of the recessed trench is from about 2.4 to about 4.4.

9. A guard according to claim 1 wherein the ceramic annulus comprises $Al_2O_3$.

10. A guard according to claim 1 wherein the inner surface of the ceramic annulus is radially stepped.

11. A method of manufacturing a guard for an electrostatic chuck, the method comprising:
   (a) machining a ceramic annulus to have
      an inner surface shaped to fit around a circumference of the electrostatic chuck, and
      an outer surface comprising (i) a top portion with a recessed trench, and (ii) a side portion; and
   (b) arc spraying a metal coating on the top portion of the outer surface.

12. A method according to claim 11 further comprising, between steps (a) and (b), texturizing the top portion of the outer surface to improve the adhesion of the metal coating to the top portion.

13. A method according to claim 12 wherein texturizing the top portion comprises scratching the outer surface.

14. A method according to claim 11 wherein (a) comprises machining the ceramic annulus from a ceramic preform comprising $Al_2O_3$.

15. A method according to claim 11 wherein (a) comprises machining the ceramic annulus from a tube.

* * * * *